June 19, 1962 G. R. BECHTELL 3,039,498

APPARATUS FOR FORMING COMPONENT LEAD WIRES

Filed Dec. 3, 1959 2 Sheets-Sheet 1

INVENTOR.
GEORGE R. BECHTELL
BY George Sullivan
Agent

INVENTOR.
GEORGE R. BECHTELL
BY George A. Sullivan
Agent 3,039,498
Patented June 19, 1962

3,039,498

APPARATUS FOR FORMING COMPONENT LEAD WIRES

George R. Bechtell, San Jose, Calif., assignor to Lockheed Aircraft Corporation, Burbank, Calif.

Filed Dec. 3, 1959, Ser. No. 857,021
1 Claim. (Cl. 140—102)

This invention relates to apparatus and methods for forming component lead wires in a predetermined shape.

With the increased use of printed circuits in both military and commercial applications, the necessity of reliably and uniformly mounting large numbers of electronic components to printed circuit boards, such as is required in the mass production of equipment employing printed circuits, has become of very considerable importance. This mounting problem, however, is complicated by the fact that it has been found necessary in a variety of applications, where the equipment is to experience severe vibration or shock, to mount each electronic component, particularly the more delicate ones, in such a way that the component lead wires are formed into a carefully chosen predetermined shape. By forming each of the lead wires in this predetermined shape, it has been found possible to provide a simple and effective shock-mounting for the component, and in addition, provide a convenient way of preventing excessive heating of the component during the soldering operation. Because of the advantages to be gained by forming component lead wires in this predetermined shape, military specifications often require that all component lead wires be so formed.

The basic feature of this predetermined shape for component lead wires is in the provision of a specially-shaped hump formed in the lead wire a short distance from the component structure. The provision of such a hump, however, has become a considerable problem which has greatly slowed up the mass production of printed circuitry. This is because wire forming apparatus which have heretofore been known have not been able to provide the required predetermined shape with any degree of accuracy or uniformity. Some of these previously employed forming apparatus are particularly undesirable in that they damage the lead wire by making the necessary bend too sharp, by biting into the wire, or by unduly straining the wire at its connection point to the component structure.

Accordingly, it is the broad object of this invention to provide improved apparatus for forming component lead wires.

A more specific object of this invention is to provide new and improved component lead wire forming apparatus which is capable of rapidly, uniformly and accurately forming the lead wires of electronic components into the required predetermined shape without causing any damage thereto.

Another object of this invention is to provide apparatus in accordance with the above objects which can be provided in simple and compact form at low cost.

A further object of this invention is to provide a method for rapidly, uniformly and accurately forming the lead wires of components into the required predetermined shape without causing any damage thereto.

In a typical embodiment of the invention, the body of the component whose lead wires are to be formed and the portions of the lead wires immediately adjacent thereto are held fixed and the remaining portion of each lead wire is free to move between pins of predetermined diameter projecting from the end of a rotatable member. The location and diameter of the pins is chosen so that a simple predetermined rotation of the rotatable member causes the pins to accurately form the lead wire into the desired predetermined shape in a manner which can be uniformly repeated and which causes no damage to the lead wire.

The specific nature of the invention, as well as other objects, uses and advantages thereof, will clearly appear from the following description and from the accompanying drawing in which.

Like numerals designate like members throughout the figures of the drawing.

Figure 1:
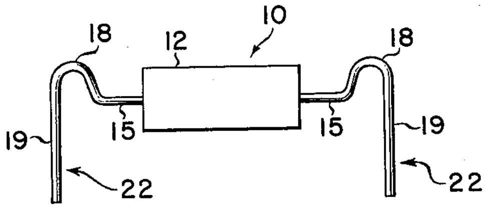
FIGURE 1 is a view of a component having its lead wires formed into the aforementioned predetermined shape which has been found most desirable when the component is to be mounted in a printed circuit board.

In FIGURE 1 an electronic component 10, such as a diode, has its lead wires 22 formed in the predetermined shape which has been found most desirable when the component 10 is to be mounted in a printed circuit board. It can be seen that the lead wires 22 are formed so that a small lead portion 15 of each lead wire 22 immediately adjacent to the body 12 of the component 10 extends outwardly from the body 12 in a conventional manner. Beyond the lead portion 15, however, each lead wire is bent to form a hump 18 before being directed substantially perpendicular to the portion 15 and the longitudinal axis of the body 12 of the component 10 as indicated at 19. The distance between the lead portions 19 is determined by the distance between corresponding holes in the printed circuit board through which the portions 19 of the lead wire 22 are to pass.

The predetermined shape into which the lead wires 22 of the component 10 are formed, as illustrated in FIGURE 1, has been found to be most advantageous in that a properly shaped hump 18 serves as a simple but effective shock absorber for the component 10, greatly reducing the shock and vibration transferred to the component structure 12. The use of a properly formed hump, such as indicated at 18, in the lead wires of components mounted to a printed circuit board has thus made it possible to mount even the most delicate components to a printed circuit board for use in applications where resistance to shock and vibration is necessary. The particular shape of the hump 18, that is, the angle of the bend of the hump and the size of the hump, is chosen in accordance with the type of shock and vibration to be expected and the natural frequency and vibration characteristics of the component being mounted, so as to achieve shock absorber action. In order to get effective shock absorber action, however, it has been found that the hump 18 must be formed with a relatively high degree of accuracy.

The provision of a hump 18 in each of the lead wires 22 as shown in FIGURE 1 has another advantage which is of considerable practical importance. The humps 18 have been found to serve as convenient lead portions to which heat-conducting means may be attached to protect the component when it is being soldered in the printed circuit. This is particularly valuable when delicate components, such as diodes, are being soldered to the printed circuit board, since excessive heat readily causes damages to components of this type.

Figures 2, 3:
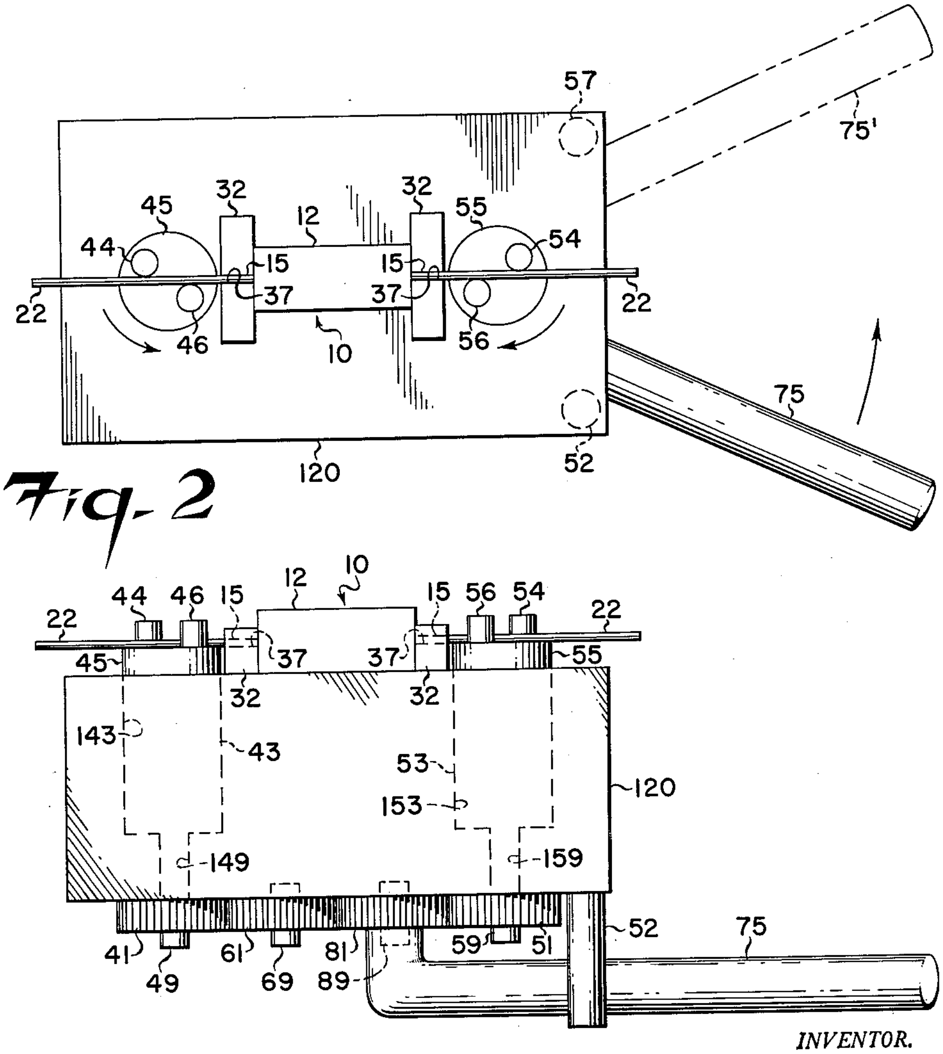
FIGURE 2 is a top view of apparatus for forming component lead wires, in accordance with the invention.
FIGURES 3 and 4 are front and bottom views of the apparatus illustrated in FIGURE 2.
Figure 4:
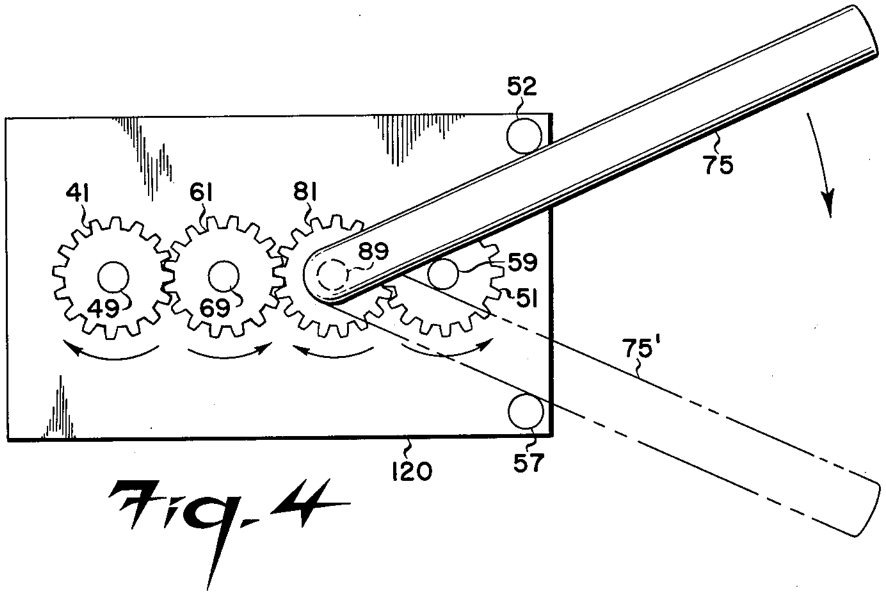

FIGURES 2, 3 and 4, respectively, show plan, front, and bottom views of an embodiment of apparatus for forming component lead wires in accordance with the invention. In FIGURES 2–4, a base member 120 has rectangular flange members 32 depending from the top thereof in space opposed relation. The flange members 32 each have a centrally located groove 37 adapted to receive lead portions 15 of a component 10 whose body 12 is interposed between the flange members 32. The spacing between the flange members 32 and the depth of their grooves 37 are preferably constructed and arranged so that the body 12 of the component 10, whose lead wires 22 are to be formed into the predetermined shape shown in FIGURE 1, will snugly fit between the flange members 32 with the ends of the body 12 substantially in contact with the sides of the flange members 32, and the bottom of the body 12 resting against the base member 120 as shown in FIGURES 2–4.

On the opposite sides of the flange members 32 from the body 12 are provided preferably cylindrical members 45 and 55 rotatably mounted in the base member 120. The cylindrical members 45 and 55 have large diameter portions 43 and 53 rotatably mounted in respective bores 143 and 153, and small diameter portions 49 and 59 extending out the bottom of the base member 120 and rotatably mounted in bores 149 and 159. Each cylindrical member has two integral pins depending from the top end thereof, the cylindrical member 45 having integral pins 44 and 46 and the cylindrical member 55 having integral pins 54 and 56. In the initial position of the apparatus shown in FIGURE 2, each of the lead wires 22 pass between the pins of the respective cylindrical member. As will hereinafter become evident, the location of these pins on the cylindrical members determines the resultant shape into which the lead wires 22 of the component 10 will be formed. For the present time, it will merely be pointed out that in order to provide the desired predetermined shape of each lead wire, none of the pins should be located with its axis coincident with the center of rotation of its respective cylindrical member.

In order to provide a predetermined rotation of the cylindrical members 45 and 55, gears 41 and 51 are secured to the respective ends of the small diameter portions 49 and 59 extending from the bottom of the base member 120, as shown in FIGURES 3 and 4. A driving gear, 81, rotatably mounted on a shaft 89 in the base member 120, has a handle 55 suitably mounted thereto so as to permit the gear 81 to be rotated thereby. The handle 75 is adapted to be rotated between an initial and final position, as determined by the shafts 52 and 57 depending from the bottom of the base member 120 at the right-hand corners thereof. In FIGURES 2 and 4, the solid-line handle 75 indicates the initial position of the handle while the broken line handle 75′ indicates its final position.

It will now be understood that movement of the handle 75 from its initial position adjacent the shaft 52 to its final position adjacent the shaft 57 causes a predetermined rotation of the driving gear 81 to which it is secured. The driving gear 81 is adapted to mesh with the gear 51 secured to the small diameter portion 59 of the member 55 thereby transmitting a corresponding predetermined rotation thereto in the direction shown by the arrows in the figures. The driving gear 81 is caused to provide the same rotation of the gear 41 as was provided for the gear 51, but in the opposite direction, by means of a suitably chosen coupling gear 61 rotatably mounted to a shaft 59 in the base member 120, and adapted to mesh with both the gears 41 and 81. The result, therefore, is that movement of the handle 75 from its initial to its final position causes substantially the same predetermined rotation of the cylindrical members 45 and 55, but in opposite directions as indicated by the arrows in FIGURE 2.

Figure 5:
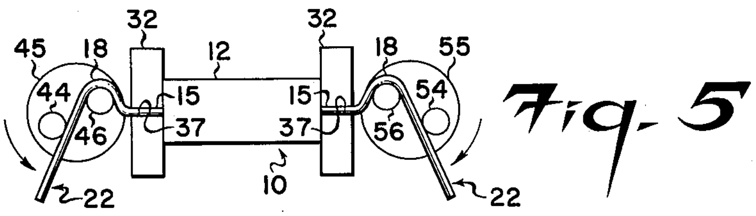
FIGURES 5 and 6 are partial plan views showing various stages of the forming of the lead wires of a component by means of the apparatus shown in FIGURES 2–4.
Figure 6:
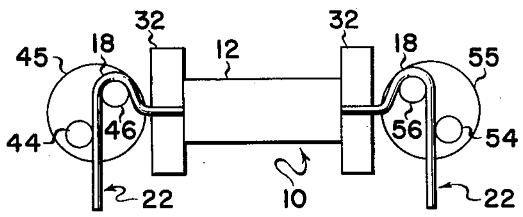

The operation of the apparatus illustrated in FIGURES 2–4 can now be explained with the aid of the partial plan views of FIGURES 5 and 6 illustrating intermediate and final stages of operation. FIGURE 2 illustrates the initial position of the apparatus with the handle 75 in its initial position. The component 10 is then dropped into the position shown with its body 12 between the flange members 32 and each of its lead wires 22 having a small portion 15 immediately adjacent the body 12 held in the groove 37, and the remaining portion of each lead wire 22 passing between and preferably having opposite sides in contact with the pins of the respective cylindrical member. As the handle 75 is now moved towards its final position, the cylindrical members 45 and 55 rotate by equal amounts in opposite directions as described previously. The rotation of the cylindrical members 45 and 55 causes the respective pins to act to bend the free portions of the lead wires 22 as shown in FIGURE 5, the body 12 and the lead portions 15 of the lead wires 22 being held fixed by the flanges 32 and the grooves 37.

FIGURE 6 shows the final position of the members 45 and 55 and their respective pins which produce the desired predetermined shape of the lead wires 22 of the component 10 as shown in FIGURE 1. It now becomes evident that a simple rotation of the members 45 and 55 produces the somewhat awkward-looking bend in the lead wires 22, permitting the desired hump 18 to be obtained. It will be apparent to those skilled in the art that the type and size of hump 18 obtained is determined by the amount of rotation provided, and the diameter of the pins and their location, both with respect to each other and the axis of rotation. From the foregoing description and operation of the invention, those skilled in the art will be able to choose the location and diameter of the pins of each cylindrical member in conjunction with the amount of rotation provided so as to obtain any predetermined lead wire shape required to provide shock absorber action for a particular component.

It may be noted at this time that the lead wires 22 are not damaged in any way by the forming operation. Also, no strain is put on either the lead wires 22, or the point where the structure 12 is connected to the lead wires 22, because as the members 45 and 55 rotate, any strain is taken up by the sliding of the free portions of the lead wires 22 against their respective pins. It may also be noted that since the resultant shape of the lead wires 22 obtained is dependent upon the location and size of the pins and the amount of rotation provided, an accurate predetermined shape can repeatably and rapidly be produced for large quantities of components using the simple apparatus exemplified in FIGURES 2–4.

Now considering the location of the pins in more detail, it can be seen that the pins 44 and 54 are the ones which act to bring the lead wires 22 into a position where the final portions thereof will be perpendicular to the axis of the component structure 12 as shown in FIGURE 6. The pins 46 and 56, on the other hand, are the ones around which the humps 18 are formed. The diameter of the pins 46 and 56, is important in determining the resultant shape of the hump 18, while the diameter of the pins 44 and 54 is relatively unimportant. It will thus be apparent that since the initial position of each pair of pins is as shown in FIGURE 2 and the final position is as shown in FIGURE 6, it is possible to choose the location and diameter of these pins to provide any desired size or shape of hump 18, in response to a predetermined rotation of the cylindrical members 45 and 55. It will also be apparent that the pins of the members 45 and 55 may be other than cylindrical and all pins need not be of the same size or located along the same diameter as shown in the figures of the drawing. The important requirement is that each pin not be in the axis of rotation, since both pins of a cylindrical member must move to act on the lead wire in order to produce the predetermined shape illustrated in FIGURES 1 and 6.

Upon consideration of the predetermined shape desired for each lead wire and the location of the pins required to produce this shape, it will be realized that the angle of rotation of the cylindrical members 45 and 55 will ordinarily be no greater than 90°. In the illustrative embodiment of the drawing where each pair of pins is located on the same diameter of its respective member a rotation of exactly 90° brings the free portions beyond the hump 18 into a position where they are directed perpendicularly to the longitudinal axis of the body 12. If the pins were not on the same diameter, the angle of rotation required would be less than 90°.

It should be realized that many variations and modifications of the apparatus illustrated in the drawing are possible without departing from the scope of the invention. For example, various members may be made adjustable so as to permit different predetermined shapes to be obtained, or to permit different sizes of components to be used in the same apparatus. Also, refinements may be added such as means for initially positioning the component, means for ejecting the component after its lead wires have been shaped, and spring means to return the handle 75 to its initial position after the component has been ejected. Also, if desired a remote operated system may be provided whereby air pressure or a suitable motor is used to produce the desired rotation in response to the closing of a switch by the operator. Additionally, two or more components could have their lead wires shaped at the same time if mass production were desired.

The above modifications and refinements are not exhaustive and are presented merely for exemplary purposes. The invention is to be considered as including all modifications and variations in the construction and arrangement of the apparatus shown in the drawing which are within the scope of the invention as defined in the appended claim.

I claim as my invention:

Apparatus for forming the lead wire of a component into a predetermined shape comprising a base member, first and second flange members depending from the top side of said base member, each of said first and second flange members having a groove extending from opposite ends thereof, said first and second flange members being spaced apart a distance about the same as the axial length of said component to securely hold said component when inserted therebetween with a predetermined portion of each of the lead wires immediately adjacent the component passing through the respective grooves of said first and second flange members to securely hold the predetermined portion of each of said lead wires, the remaining portion of each of said lead wires being unrestricted, first and second cylindrical members rotatably mounted in said base member and extending through the top side thereof and respectively adjacent the outside end of said first and second flange members, the axis of rotation of said first and second cylindrical members being substantially perpendicular to the longitudinal axis of said component and substantially perpendicular to the axis of said groove, first and second pins projecting from the top end of each of said first and second cylindrical members in a direction substantially parallel to and equispaced from the axis of rotation thereof and included in a common diameter of each of said first and second cylindrical members, said first and second cylindrical members being located in said base member so said first and second pins projecting therefrom can be rotated to an initial position at which they contact opposite sides of the remaining portion of the respective lead wires, means operatively connected to said first and second cylindrical members for simultaneously rotating each of said first and second cylindrical members about ninety degrees from said initial position.

References Cited in the file of this patent

UNITED STATES PATENTS

| | | |
|---|---|---|
| 685,603 | Harris | Oct. 29, 1901 |
| 1,610,201 | Cavagnaro | Dec. 7, 1926 |
| 2,430,899 | Wallace | Nov. 18, 1947 |
| 2,458,536 | Sherman | Jan. 11, 1949 |
| 2,830,625 | Gasper et al. | Apr. 15, 1958 |
| 2,877,809 | Zapf | Mar. 17, 1959 |
| 2,955,624 | Ferm | Oct. 11, 1960 |